United States Patent [19]

Stewart

[11] Patent Number: 5,198,961
[45] Date of Patent: Mar. 30, 1993

[54] CONTROL MODULE FOR ELECTRICAL APPLIANCE

[75] Inventor: Richard F. Stewart, North Brunswick, N.J.

[73] Assignee: White Consolidated Industries, Inc., Cleveland, Ohio

[21] Appl. No.: 819,770

[22] Filed: Jan. 13, 1992

[51] Int. Cl.[5] .............................................. H05K 7/20
[52] U.S. Cl. .................................. 361/380; 174/52.1; 174/254; 361/384; 361/398
[58] Field of Search ....................... 220/3.2, 6; 312/258; 174/16.1, 52.1, 55, 56, 254; 361/331, 334, 340, 356, 380, 383, 384, 395, 398, 392, 385, 393, 394; 62/414, 418

[56] References Cited

U.S. PATENT DOCUMENTS

| | | | |
|---|---|---|---|
| 3,585,456 | 6/1971 | Phillips, Jr. | 174/38 |
| 4,143,932 | 3/1979 | Boutros | 361/398 |
| 4,365,288 | 12/1982 | Robe | 363/141 |
| 4,894,663 | 1/1990 | Urbish | 343/702 |
| 4,939,792 | 7/1990 | Urbish | 455/347 |
| 5,008,496 | 4/1991 | Schmidt | 174/254 |

Primary Examiner—Gerald P. Tolin
Attorney, Agent, or Firm—Pearne, Gordon, McCoy & Granger

[57] ABSTRACT

A control module is disclosed for mounting in an electrical appliance that provides a supporting base for assembly of electrical components to include control elements forming part of a control panel. The module includes a relatively flat base formed of relatively stiff, molded material with a transverse linear zone extending thereacross to divide the base into a rearward section and a forward control panel section. The linear zone is of sufficiently reduced thickness that it provides a hinge means so that the front and rear sections may be pivoted relative to one another between a relatively flat assembly condition and a final mounting condition. After assembly and flexing of the sections, the module may be mounted in an appliance with the front section serving as a portion of a manually operable control panel for the appliance.

2 Claims, 4 Drawing Sheets

CONTROL MODULE FOR ELECTRICAL APPLIANCE

BACKGROUND OF THE INVENTION

This invention relates to electrical appliances of various types, such as for home use and especially to a control module for such appliances whereon electrical control components may be conveniently mounted along with electrical control means conventionally positioned on a control panel when installed in the appliance. More particularly, the invention relates to a unique mounting base for a control module wherein mounting and assembly of control components are greatly facilitated.

Electrical appliances for home use, such as room air conditioners and the like require, in addition to the primary operating components (e.g., compressor, blower motor, etc.) a control system to include switches, sensors, timers, etc., as well as a control panel with manually operable knobs, etc. These control components are frequently the most difficult items to assemble and secure in the appliance. Also, they are the components most frequently in need of service and repair.

Usually, the adjustment, repair and replacement of these components requires disassembly of the entire appliance, all of which is inconvenient and time-consuming.

The present invention provides a unique module for the electrical components and control panel assembly, referred to above, by which assembly and mounting are greatly simplified and which also provides convenient removal without disassembly of the entire appliance.

SUMMARY OF THE INVENTION

It is among the objects of the present invention to provide a convenient control module adapted for mounting in an electrical appliance in such a way that removal of the module for repair and replacement of electrical control components is greatly facilitated.

Another object is to provide a unique mounting base for a control module which simplifies the assembly of control components.

A further object is to provide a mounting base for an electrical control module for an electrical appliance, which provides a convenient horizontal mounting surface for both the electrical components to be mounted thereon and for control elements such as switches, etc., that ultimately provide the control panel for the user of the appliance.

These and other objects and advantages are achieved with the unique control module of the invention. The module is adapted for use in connection with an electrical appliance such as a room air conditioner, for example, wherein control components must be connected to electrical operating equipment and wherein manually operable switches and other control elements must be provided in an accessible location on the appliance.

The module comprises a relatively flat base formed of molded plastic material and being adapted for location generally in a horizontal position to facilitate mounting of the various electrical components and control elements including switches and the like. The base has a lateral zone of relatively thin section extending thereacross to separate the base into a main portion and an adjacent panel portion. The transverse zone of relatively thin section provides a hinge means so that the two sections may be pivoted relative to one another about 90 degrees.

With this arrangement, the forward portion containing control switches and other control elements may be pivoted from a horizontal position to a vertical position whereupon the entire module may be inserted in an opening in the housing for the appliance to position the manually operable controls in a convenient position for the user while at the same time locating the electrical control components internally within the appliance.

DETAILED DESCRIPTION OF THE DRAWINGS

Figure 1:
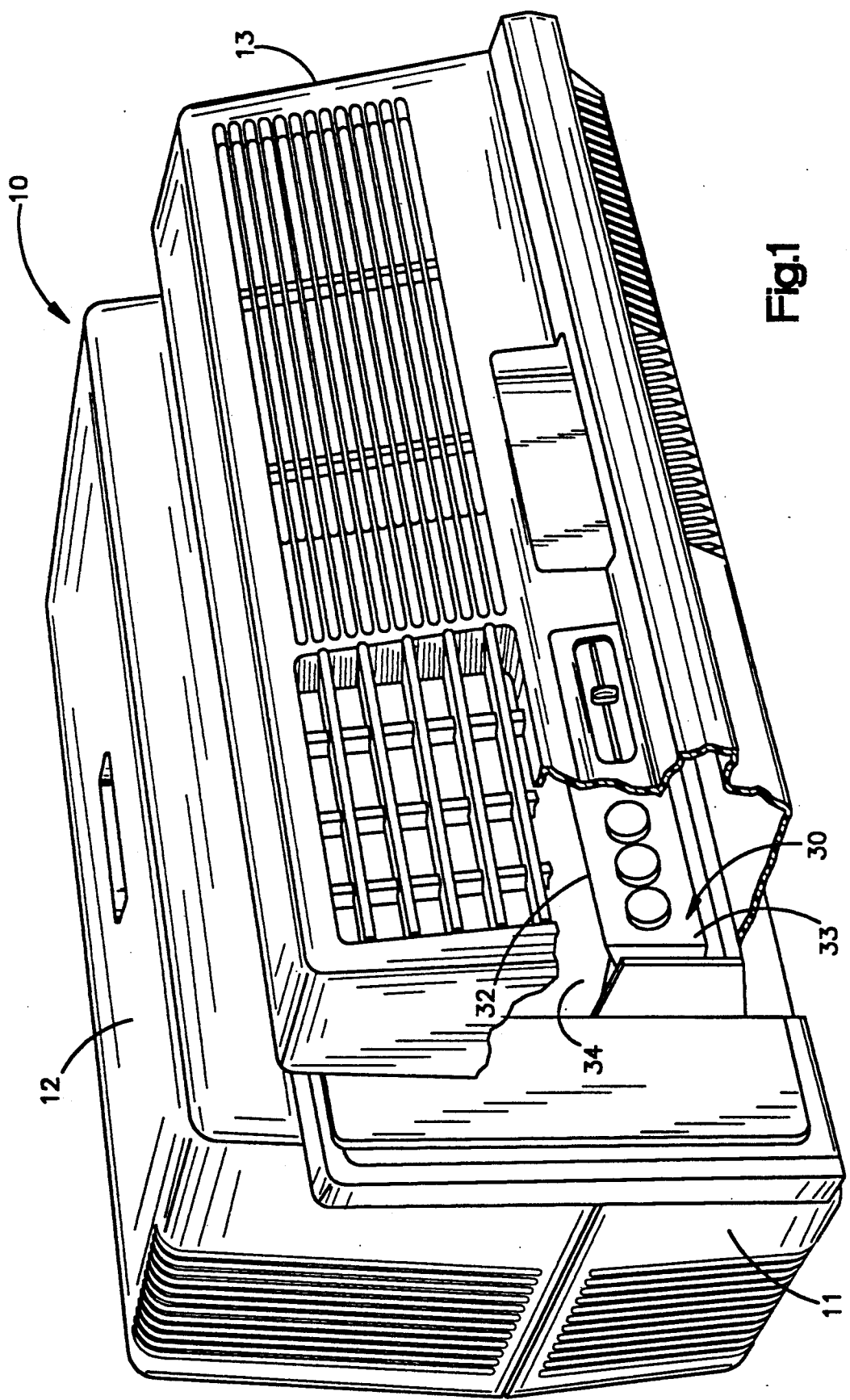
FIG. 1 is a perspective view of a room air conditioner that utilizes an electrical control module embodying the invention and with parts broken away for the purpose of illustration.
Figure 2:
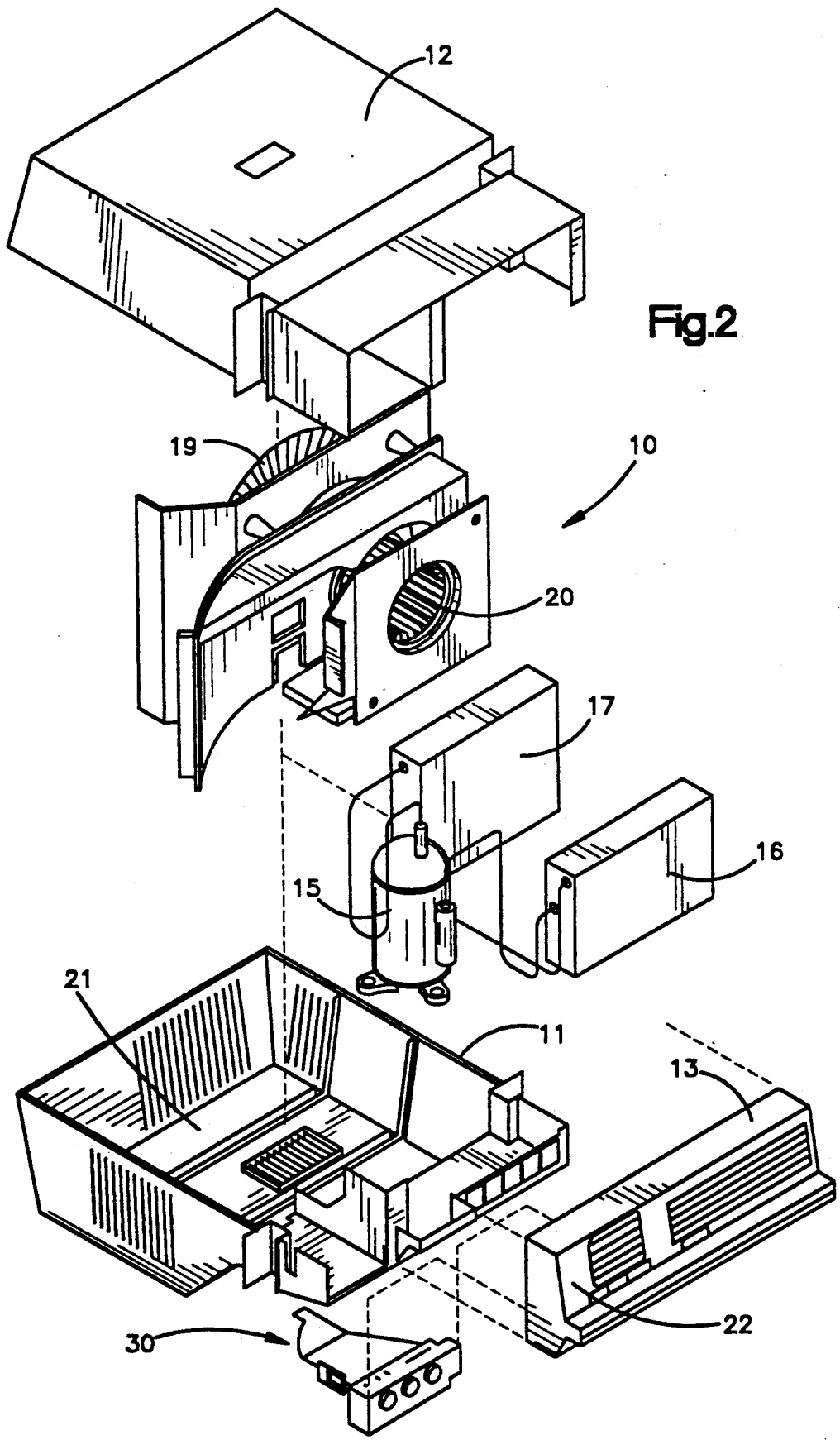
FIG. 2 is an exploded perspective view of the room air conditioner of FIG. 1 showing the appliance in disassembled form and also illustrating a control module embodying the invention and the manner in which it is associated with the other components of the appliance.

Referring more particularly to the drawings, FIGS. 1 and 2 illustrate a typical room air conditioner 10 adapted to utilize an electrical control module 30 embodying the invention. It will be understood that the electrical control module of the invention may be used in a variety of different types of electrical appliances and that the description herein relates to use of the module in a room air conditioner only as being an exemplary application of the invention.

The room air conditioner 10 includes three molded housing sections that are adapted to fit together and be secured to one another. These include a lower housing section 11, an upper housing section 12 and a front or forward housing section 13. In assembled condition, these housing sections define an enclosure 14 for the various components of the appliance.

The front housing section 13 has an opening formed therein at the left hand side, as viewed in FIGS. 1 and 2, which opening is adjacent the front portion of the control module 30. The control module 30 is located mostly in the front housing portion 13 and is adapted to contain the electrical control components and a control panel for the appliance.

Located in the enclosure and mounted on the lower housing section 11 are a compressor 15, a condenser heat exchanger 16 and an evaporator heat exchanger 17. An electrical motor, controlled by electrical control components on the control module 30, provides driving means for an axial flow fan 19 and a centrifugal blower wheel 20, which operate in a conventional manner utilized in the air conditioning art.

The lower housing section has a generally horizontal floor 21 on which the various components described above are mounted and a sloping flow control panel 22 extending upwardly toward an air outlet grill formed in the upper left hand portion of the front housing section 13.

Figure 3:
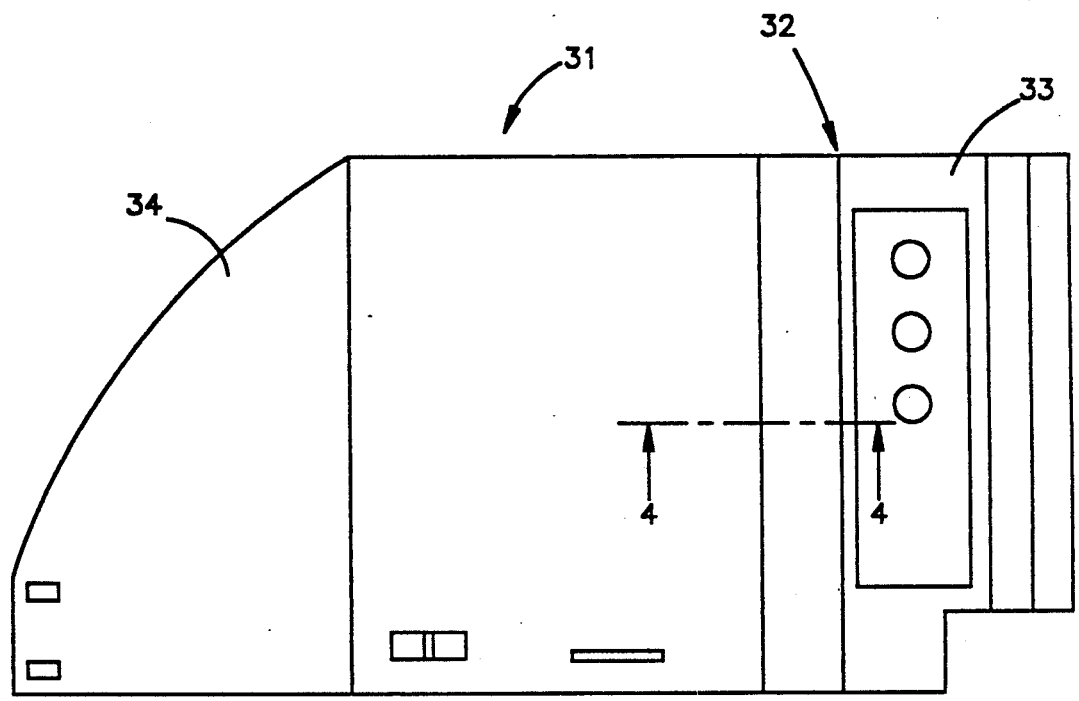
FIG. 3 is a plan view of the base for the control module utilized in the electrical appliance of FIGS. 1 and 2 and shown prior to assembly and installation.
Figure 4:
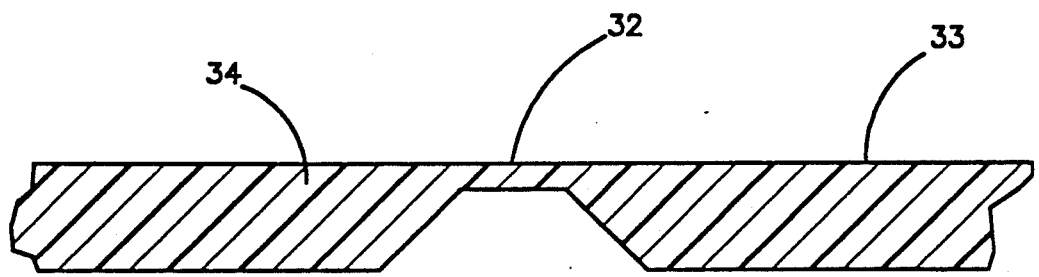
FIG. 4 is a sectional view on an enlarged scale taken on the line 4—4 of FIG. 3.
Figure 5:
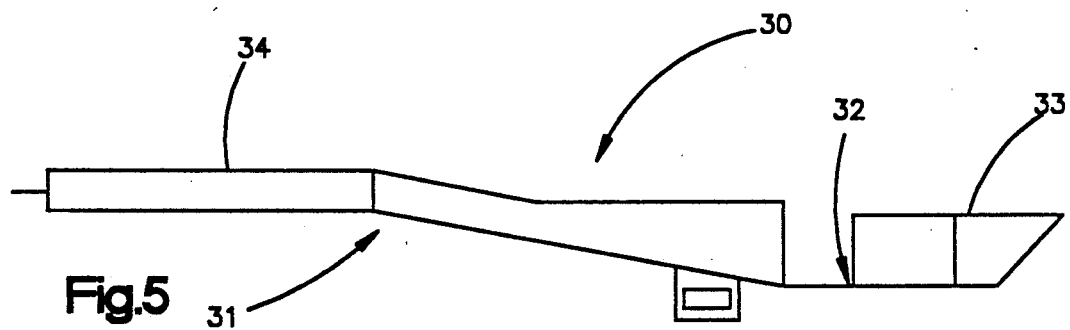
FIG. 5 is a side elevation of the base for the control module shown prior to assembly.

Referring to FIGS. 3 to 5, the control module 30 includes a relatively flat base 31 formed of a molded plastic material. In accordance with the invention, the base 31 is provided with a lateral zone 32 of relatively thin section that separates the base into a forward section 33 and a somewhat larger rearward section 34. The lateral zone 32 is linear and is sufficiently thin that considering the particular moldable plastic material utilized, flexing of the front section 33 relative to the rear section is readily accommodated.

More particularly, the flexure available permits the front section 33 to be pivoted 90° or more relative to the plane of the rear section. Thus, the lateral zone 32 functions essentially as a live hinge for the molded base 31.

In the assembly of the control module 30, electrical components including the components 35 and 36 are mounted in conventional manner on the rear section 34 and connected to a wiring harness containing leads 37, 38 and 39 which in turn are adapted to be connected to operating components to include the compressor 15 and motor. This is shown in FIG. 6.

Figure 6:
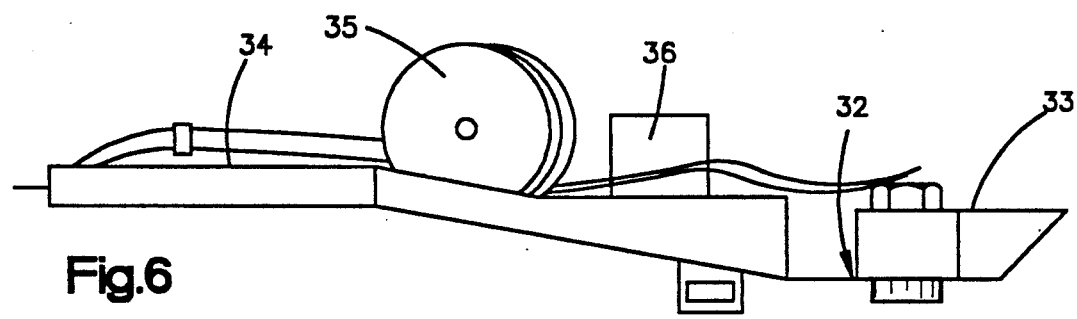
FIG. 6 is a side elevation similar to FIG. 5 showing the initial assembly of the control module.

At the same time, the manually operable switches and other control elements that are adapted to be actuated by the user are mounted on the initially horizontal front section 33 which, as indicated in FIGS. 5 and 6, is initially positioned in a plane generally coplanar with the plane of the rear section 34. Once the manually operable elements are so mounted, the wiring harness may be connected to the compressor 15, motor, etc., for electrical testing of components before the module 30 is inserted in the housing for the electrical appliance 10.

Figure 7:
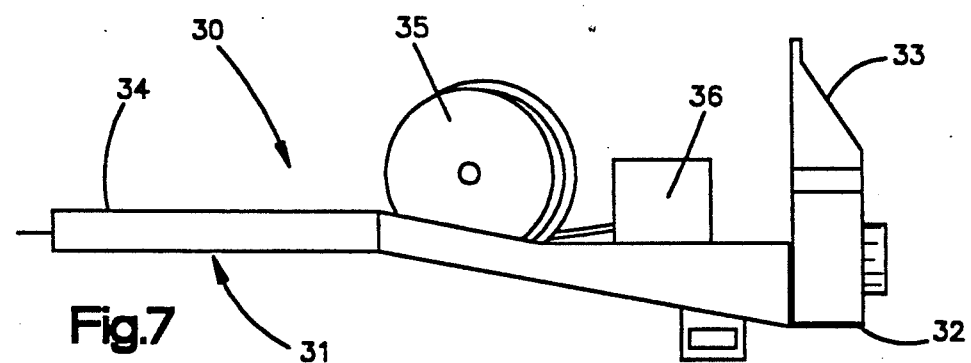
FIG. 7 is a side elevation similar to FIGS. 5 And 6 showing the front panel section pivoted about its live hinge to an angle of about 90° relative to the main mounting section.
Figure 8:
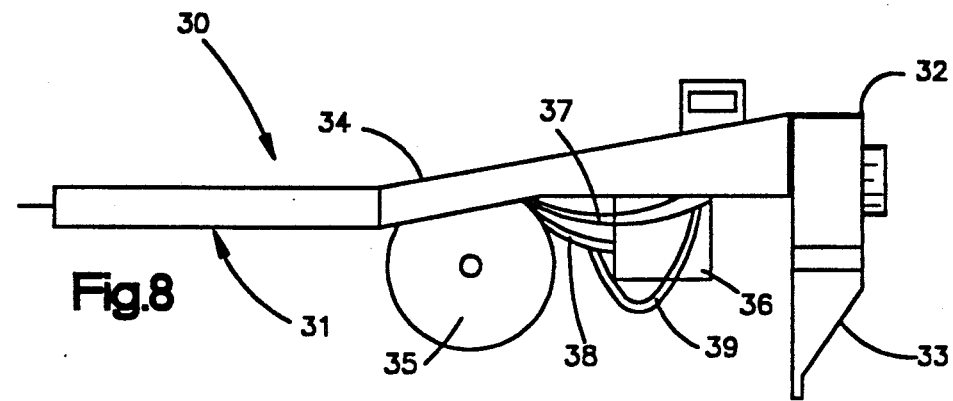
FIG. 8 is a side elevation of the control module of the invention showing the assembly inverted relative to FIG. 7, preparatory to installation in the appliance.

Once these connections are made, the front section 33 may be pivoted 90° relative to the rear section 34, as shown in FIG. 7, so that the front section with its assembled control elements forms a control panel for the appliance. With the module in this condition, it is turned upside down (FIG. 8), inserted into the enclosure 14 and secured in place by appropriate fastening means.

A particular advantage of the control module of the present invention is that it is easily removed for service, repair and replacement of parts. After service, repair or replacement of components, the module may be then easily reinserted and mounted in the enclosure 14. Since the control panel is integral with the rest of the control module, the ease of servicing is greatly enhanced.

Another significant advantage of the control module 30 thus described is that it permits the base for the module to be placed in a horizontal position during the assembly and connection of all the control components so that they are all connected and positioned in proper relation to one another prior to the insertion of the module into the enclosure for the electrical appliance.

While the invention has been shown and described with respect to a preferred embodiment thereof, this is for the purpose of illustration rather than limitations and other variations and modifications of the specific device herein shown and described will be apparent to those skilled in the art. Accordingly, the patent is not to be limited in scope and effect to the specific embodiment herein shown and described, nor in any other way that is inconsistent with the extent to which the progress in the art has been advanced by the invention.

What is claimed is:

1. In an electrical appliance, a control module comprising:
    a base member formed of relatively stiff material and being adapted to support electrical control components for said appliance;
    means defining a transverse linear zone across said base to divide said base into a rear section and a front section,
    manually operable control components mounted on said front section;
    control circuit components mounted in said rear section;
    said linear zone being of sufficiently reduced thickness compared to the rest of the base member as to provide a hinge means whereby said front and rear sections are pivoted relative to one another up to about 90° between an initial, relatively flat coplanar condition and a final mounting condition with said sections being approximately at right angles and with said manually operable control components being on a face of said front section facing away from said rear section; and
    module support means supporting said module in said appliance in said final mounting condition;
    whereby said control module is secured in said appliance with said front section in a generally upright position and provides a manually operable control panel for said appliance.

2. An appliance and control module as defined in claim 1, wherein said electrical appliance is a room air conditioner.

* * * * *